United States Patent
Falkenstein

(10) Patent No.: US 9,213,065 B2
(45) Date of Patent: Dec. 15, 2015

(54) METHOD AND DEVICE FOR DETECTING A MALFUNCTION OF AN ELECTRIC MACHINE THROUGH THE MODULATION OF VARIABLES INFLUENCING THE TORQUE OF THE MACHINE

(75) Inventor: Jens-Werner Falkenstein, Aalen (DE)

(73) Assignee: Robert Bosch GmbH, Stuttgart (DE)

( * ) Notice: Subject to any disclaimer, the term of this patent is extended or adjusted under 35 U.S.C. 154(b) by 160 days.

(21) Appl. No.: 13/983,447

(22) PCT Filed: Dec. 7, 2011

(86) PCT No.: PCT/EP2011/072110
§ 371 (c)(1),
(2), (4) Date: Aug. 2, 2013

(87) PCT Pub. No.: WO2012/103975
PCT Pub. Date: Aug. 9, 2012

(65) Prior Publication Data
US 2013/0307577 A1    Nov. 21, 2013

(30) Foreign Application Priority Data
Feb. 3, 2011  (DE) .................. 10 2011 003 573

(51) Int. Cl.
*G01R 31/34*    (2006.01)
(52) U.S. Cl.
CPC .............. *G01R 31/34* (2013.01); *G01R 31/343* (2013.01)
(58) Field of Classification Search
CPC .... G01R 31/343; G01R 31/34; G01R 31/346; G01R 31/024; G01R 33/4625; H02P 6/002; H02P 2203/05; H02P 29/021; H02P 6/10; H02P 6/182; H02P 25/12; H02P 9/04; H02P 9/14; H02P 21/06; H02P 21/00; H02P 21/005; H02P 21/04; H02P 6/16; H02P 25/023; H02P 27/12; H02P 29/022; H02P 6/165; H02P 7/00; H02P 9/009; H02P 21/148; G01B 7/003; G01P 3/48; H02K 29/03; H02K 29/08; H02K 1/2766; H02K 19/103; H02K 11/0031; G01M 13/028; G01M 13/025; G01H 1/00; G05B 17/02
See application file for complete search history.

(56) References Cited

U.S. PATENT DOCUMENTS

| | | | |
|---|---|---|---|
| 6,392,418 B1 * | 5/2002 | Mir et al. ................ | 324/503 |
| 7,193,387 B1 * | 3/2007 | Lu et al. ................. | 318/800 |
| 8,253,365 B2 * | 8/2012 | Yeh ......................... | 318/490 |
| 8,354,817 B2 * | 1/2013 | Yeh et al. ................ | 318/812 |
| 2008/0136380 A1 | 6/2008 | Hoffmann et al. | |
| 2008/0252246 A1 | 10/2008 | Ehlich et al. | |
| 2010/0320953 A1 | 12/2010 | Yeh et al. | |

FOREIGN PATENT DOCUMENTS

| | | |
|---|---|---|
| CN | 101025430 | 8/2007 |
| CN | 101755221 | 6/2010 |

(Continued)

OTHER PUBLICATIONS

International Search Report for Application No. PCT/EP2011/072110 dated Apr. 5, 2012 (2 pages).

*Primary Examiner* — Vinh Nguyen
(74) *Attorney, Agent, or Firm* — Michael Best & Friedrich LLP

(57) ABSTRACT

A method for detecting the malfunction in a three-phase synchronous electric machine by modulating variables. Two variables, which influence the torque of the electric machine are modulated. The first variable represents the q component of the stator current. The second variable represents the rotor flux. The variables are modulated by superimposing on their base signals, a test signal. Under faultless operation of the machine, there is no effect caused by the modulated variables on an electrical or magnetic parameter of the machine. When the modulated variables cause an effect on an electrical or magnetic parameter of the machine, a fault condition is detected.

21 Claims, 1 Drawing Sheet

(56) References Cited

FOREIGN PATENT DOCUMENTS

| EP | 1387459 | 2/2004 |
| EP | 2226929 | 9/2010 |
| JP | 5895959 | 6/1983 |
| JP | 08123553 | 5/1996 |
| JP | 2004096979 | 3/2004 |
| JP | 2008091055 | 4/2008 |
| JP | 2009183062 | 8/2009 |

* cited by examiner

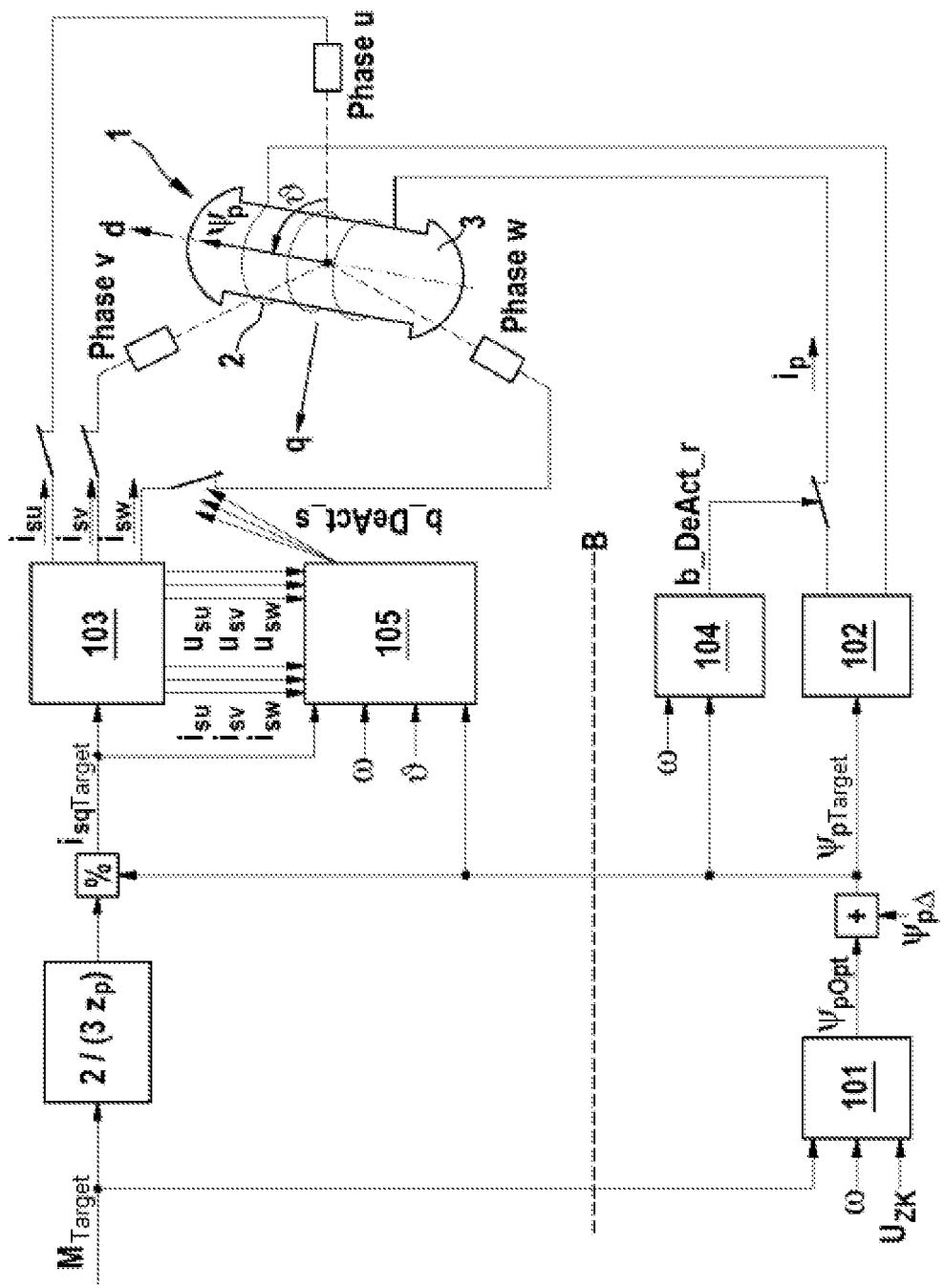

METHOD AND DEVICE FOR DETECTING A MALFUNCTION OF AN ELECTRIC MACHINE THROUGH THE MODULATION OF VARIABLES INFLUENCING THE TORQUE OF THE MACHINE

BACKGROUND OF THE INVENTION

The invention relates to a method for detecting a malfunction of an electric machine, in which a first variable influencing the torque of the electric machine is modulated, and also to a device for carrying out the method.

The torque of an electric machine can be influenced by a number of independent variables. Suitable measuring systems for directly determining a torque output or power output of electric machines are not normally provided in motor vehicle drivetrains. For example, the measurement of a driveshaft torque is omitted for cost reasons. A desired torque output or power output of the electric machine therefore cannot be determined directly. In particular in the case of electric or hybrid vehicles, there may be a force-locked connection between an electric machine and the drive wheels of the vehicle, even when the vehicle is stationary. An undesired torque output or power output of an electric machine, for example due to a fault in the data communication or due to a component fault, may then cause a highly safety-critical movement of the motor vehicle, which goes against the driver's wishes.

In electric vehicles and hybrid vehicles, high electric machine outputs are used, and therefore high undesirable accelerations or decelerations may occur in the event of a fault. This leads to unstable driving dynamics, wherein, in particular with high decelerations, the driver hardly has the chance to counter-react. Should the electric machine supply an excessively small torque, this may also result in safety-critical driving situations. If, for example for regeneration, part of the total braking torque is to be taken over by the electric machine, it may be that said electric machine does not convert its proportion of braking torque however.

A method for fault detection in a drive arrangement is known from EP 1387459 A1, in which the drive arrangement comprises a polyphase electric motor and a convertor arranged downstream of the electric motor, in which the convertor controls the voltage at the individual phases of the electric motor, wherein the phase currents each run periodically in the phases of the electric motor. For fault detection of the electric motor, a number of phase currents of the electric motor are measured. Here, there is a sinusoidal modulation of the voltages of the electric machine.

Due to safety and monitoring reasons, it is thus necessary to have accurate knowledge of the correct torque output or power output of the electric motor and a possibility for rapid and effective intervention in the event of a fault.

SUMMARY OF THE INVENTION

In a method for detecting a malfunction of an electric machine, the malfunction of an electric machine is detected and an associated undesirable torque output or power output of the electric machine is reduced. Since a second variable influencing the torque of the electric machine is modulated, wherein, in the event of faultless operation, the two variables influencing the torque compensate for one another in terms of their effect on a parameter of the electric machine, in particular a torque, a speed, an electric parameter and/or a magnetic parameter, whilst it is concluded that there is a malfunction in the event of the lack of such a compensation, assertions concerning the behavior of the mechanical torque of the electric machine can be reliably made with the use of the electrical variables.

Here, the modulation of a variable influencing the torque of the electric machine is to be understood to mean a change to said variable, in particular a superimposition of said variable with a test signal. Here, such a test signal may be variable in particular over time and in terms of its shape (for example rectangle, (sinusoidal) vibration, sawtooth, trapezium).

The first variable influencing the torque is advantageously associated with a stator of the electric machine, whereas the second variable influencing the torque is associated with a rotor of the electric machine. Two physically different variables, which influence the mechanical torque of the electric motor, are thus varied in order to detect a malfunction of the electric machine. Only in the event of faultless operation of the electric machine does the variation of these two physically different variables lead to a compensation in terms of their effect on a parameter of the electric machine, in particular the torque, the speed, an electric parameter and/or a magnetic parameter.

In one embodiment, the variable associated with the stator is a stator current, whereas the variable associated with the rotor is a rotor flux. In order to check the malfunction of the electric machines, only the physical variables acting directly on the function of the electric machine are therefore influenced.

In a development, the first and the second variable influencing the torque of the electric machine are modulated by modulating a test signal to the base signal of the respective variable. These different test signals are necessary since the stator current and the rotor flux are two physically different variables, which require physically different or differently scaled test signals. For example, test signals are a share modulated to the stator current and a share modulated to the excitation current forming the rotor flux.

In a variant, a signal boundary is taken into account during the modulation of the test signal to the base signal, wherein the test signal is selected such that, after modulation, the modulated base signal does not exceed the signal boundary. It is thus ensured that, even after modulation, a modulated base signal is present that can be used completely to check the malfunction of the electric machine since the signal boundary is not exceeded by the base signal and test signal together. If the signal boundary were exceeded by the modulated base signal, this would entail a distortion of the modulated base signal during the electronic processing, such that the test results would not be meaningful. During modulation of the variable influencing the torque of the electric machine, attention is also to be paid to the signal boundary of the other variable influencing the torque of the electric machine so that the compensation of the two variables in terms of their effect on a parameter of the electric machine is ensured in the event of faultless operation. Alternatively, signal boundaries are permitted, wherein the test signals of the two variables influencing the torque of the electric machine are matched to one another such that, even with active signal boundaries, the compensation is ensured in the event of faultless operation of the electric machine.

At least one test signal advantageously consists of a vibration. The use of a vibration as a test signal has the advantage that such a test signal adapts well to the operating mode of the electric machine. The vibration is preferably selected such that, in the event of a fault of the electric machine, the torque of the electric machine is not changed over time on average. An additional acceleration or deceleration of the vehicle by the test signal is thus avoided since the frequency of the vibration is selected so as to be high enough, for example approximately 5 periods of vibration per second.

In one embodiment, the test signals are modulated continuously to the first and second variable influencing the torque of the electric machine. Due to this continuous approach, the electric machine is constantly inspected for a malfunction, whereby critical states of the electric machine are detected directly. A direct reaction to a detected malfunction is thus possible.

In an alternative, the test signals in at least one defined operating state of the electric machine are modulated to the first and the second variable influencing the torque of the electric machine. The examination of the malfunction is thus set for example in an operating state of the electric machine in which high accelerations or decelerations occur, for example during the regenerative mode of the electric machine. In particular, safety-critical driving situations can therefore be monitored reliably.

In a particularly simple development, the first and the second variable influencing the torque of the electric machine are modulated with test signals, which have an opposed sign, whereby, in the event of faultless operation of the electric machine, the modulations of the first and of the second variable influencing the torque of the electric machine compensate for one another in terms of their effect on the parameter of the electric machine, in particular the speed, the torque, the electric parameter and/or the magnetic parameter, whilst it is concluded that there is a malfunction on the basis of the lack of such a compensating effect on the parameter of the electric machine, in particular the torque, the speed, the electric parameter and/or the magnetic parameter. The use of test signals with opposed signs enables a particularly simple detection of the mode of operation or of the malfunction of the electric machine.

There are various evaluation options for determining whether or not there is a compensation of the effect of the two modulated variables influencing the torque of the electric machine. After the modulation of the first and second variable influencing the torque of the electric machine, an actual parameter of the electric machine is thus measured, wherein it is possible to conclude that there is faultless operation of the electric machine if this actual parameter lies within a range spanned by a predefined course over time of a predefined parameter. A specific margin of fluctuation of the actual parameter of the electric machine from the expected target parameter is therefore permitted, and it is concluded that there is faultless operation of the electric machine in spite of said deviation.

In one embodiment, after the modulation of the variable influencing the rotor of the electric machine, a first actual parameter occurring at the stator of the electric machine is measured and is compared with the range spanned by the predefined course over time of the predefined first parameter.

Alternatively, after the modulation of the variable influencing the stator of the electric machine, a second actual parameter occurring at the rotor of the electric machine is measured and is compared with the range spanned by the predefined course over time of the expected second parameter. Here, electrical parameters that have been caused or influenced due to the modulation of the variable influencing the torque of the electric machine are evaluated.

In a further approach, mechanical changes at the electric machine are evaluated by measuring, after the modulation of the first and second variable influencing the torque of the electric machine, a torsional vibration occurring at a drivetrain of the motor vehicle and by comparing this with a range spanned by the predefined course over time of a predefined torsional vibration. In the event of modulation with a vibration-shaped test signal, torsional vibrations are excited in the drivetrain in the event of a malfunction. Due to the generally linear vibration behavior of a drivetrain of the motor vehicle, the torsional vibrations have the same frequency as the test signal. Corresponding torsional vibrations can be established on the basis of speed signals, for example by means of correlation calculations. A malfunction is then detected when the torsional vibration amplitudes exceed a predefined threshold.

Another possibility for evaluating the malfunction of the electric machine is to measure, after the modulation of the first and second variable influencing the torque of the electric machine, a speed output by the electric machine and to compare this with a range spanned by the predefined course over time of a predefined speed. In this case too, a malfunction of the electric machine is detected on the basis of a mechanically occurring change of the electric machine.

In one embodiment, the torsional vibration, the speed, the first actual parameter and/or the second actual parameter of the electric machine are each monitored separately from one another in a respective monitoring path. A number of different methods for detecting the malfunction of the electric machine are thus available and are based on different, independent sensors. A high redundancy when inspecting the operating behavior of the electric machine is thus achieved.

In a further embodiment, at least two independent monitoring paths are activated in order to monitor the malfunction of the electric machine. Since each monitoring path has a different evaluation method for determining the malfunction of the electric machine, a sufficient redundancy is provided even with the use of just two monitoring paths. It is concluded that there is a malfunction of the electric machine as soon as one of the monitoring paths indicates a malfunction of the electric machine. A high level of reliability is then also provided if one of the two monitoring paths is faulty. Alternatively, a malfunction of the electric machine is only acknowledged when two monitoring paths independently of one another lead to the result that there is a malfunction of the electric machine. The availability of the vehicle is thus increased.

The monitoring paths advantageously lead to at least one common switch-off path of the electric machine and/or one common path for influencing the mode of operation of the electric machine. In the event that a malfunction of the electric machine is determined, it is thus ensured that the electric machine is switched off immediately. If this is not possible however during operation of the motor vehicle, the mode of operation of the electric machine is influenced to such an extent that the relevant error states are corrected. A stepped approach is thus possible, for example by limiting the output of the electric machine if one of the monitoring paths indicates a malfunction of the electric machine. If two of the monitoring paths indicate a malfunction, the electric machine is switched off completely.

In an alternative, each of the monitoring paths leads to at least one switch-off path of the electric machine and/or one path for influencing the mode of operation of the electric machine. If a malfunction of the electric machine has been determined by just one monitoring path, it is thus ensured that the electric machine is switched off or that the mode of operation of the electric machine is influenced. If one of the switch-off paths is faulty or does not function correctly, a further switch-off path switches off the electric machine in the event of a malfunction or outputs a signal to the path for influencing the mode of operation of the electric machine.

A further development of the invention relates to a device for detecting a malfunction of an electric machine, with which a first variable influencing the torque of the electric machine is modulated. In order to detect a malfunction of an electric machine and to prevent an associated undesired torque output or power output, means are provided, which modulate a second variable influencing the torque of the electric machine, wherein, in the event of faultless operation, the two variables influencing the torque compensate for one another in terms of their effect on a parameter of the electric machine, in particular a torque, a speed, an electric parameter and/or a magnetic parameter, whilst it is concluded that there is a malfunction in the event of the lack of such a compensation. This has the advantage that, as a result of variation of electric parameters that influence the behavior of the electric machine, it is possible to draw conclusions regarding the mechanical operating mode of the electric machine. A very simple monitoring arrangement can thus be produced.

In one embodiment, a monitoring unit detecting a torsional vibration or a speed or a parameter of a stator of the electric machine or a parameter of a rotor of the electric machine comprises just one monitoring path, which is adjoined by a switch-off path of the electric machine and/or a path for influencing the electric machine. Since only one monitoring path for monitoring the malfunction of the electric machine is formed in a device, for example a control unit, there is a high redundancy when monitoring the operation of the electric machine, which means that high safety requirements are met. In addition to the monitoring of a malfunction of the electric machine, the modulation by means of a test signal can also be used for calibration and/or monitoring of sensors and/or for sensorless control of the electric machine and/or for an emergency operation of the electric machine in the event of a failure of a sensor.

BRIEF DESCRIPTIONS OF THE DRAWINGS

The invention allows numerous embodiments. One of these embodiments will be explained in greater detail on the basis of the figures illustrated in the drawing, in which:

FIG. 1: shows a schematic diagram for controlling an electric machine.

DETAILED DESCRIPTION

FIG. 1 shows an exemplary embodiment for the present invention on the basis of the example of an externally excited three-phase synchronous machine 1, which is used to drive an electric vehicle. The windings of the stator (not shown in greater detail) are denoted as phase u, phase v and phase w and are illustrated in a highly simplified manner. The coil axes of these windings are each rotated relative to one another by 120 degrees. An energized exciter winding 2 in the rotor 3 generates a rotor flux $\psi p$. A driver of the motor vehicle or a driver assistance system or a safety system of the motor vehicle predefine a target torque MTarget. The target torque MTarget is influenced by an automatic transmission during shifting operations thereof.

A field-oriented view of a three-phase machine 1 is based on the principle of the space vector. The relationships can be simplified if an orthonormal d-q coordinate system running synchronously with the space vectors is considered, of which the d-axis coincides with the direction of the rotor flux space vector $\psi r$ in the case of an asynchronous machine or with the direction of the field-effect direct-axis flux space vector $\psi p$ in the case of a synchronous machine. The space vectors can then be broken down into d-components and q-components.

Here, the q-components of the rotor flux space vector and field-effect direct-axis flux space vector disappear respectively:

$$\psi rq = 0$$

$$\psi pq = 0$$

In the case of the synchronous machine with ideal cylindrical rotor, the generated actual torque M (air-gap torque) is proportional to the q-component isq of the stator current:

$$M = 3/2 \, zp \, \psi p \, isq, \quad (1)$$

where:
zp number of pairs of poles
$\psi P = \psi pd$ rotor flux or magnet wheel flux (d-component).

In the case of the externally excited synchronous machine, the rotor flux $\psi p$ is set by the specification of an excitation current ip.

On the basis of this target torque MTarget, the rotor speed w and the currently available DC-link voltage UZK, a rotor flux $\psi pOpt$ optimized in terms of efficacy at low target torque MTarget or very high rotor speeds $\psi$ is cancelled in block 101. The dynamic of change to the rotor flux $\psi p$ is generally limited, and therefore marginal conditions, such as a torque reserve, can still be taken into account.

A test signal $\psi p\Delta$ is added or modulated to the optimal rotor flux $\psi pOpt$. The test signal $\psi p\Delta$ is selected such that the target torque MTarget can still be generated with a favorable degree of efficacy and the rotor flux target value $\psi pTarget$ thus calculated can also be adjusted. Here, the test signal $\psi p\Delta$ consists of an unaveraged vibration, which is applied continuously. An activation and modification of the test signal $\psi p\Delta$ dependent on the operating point of the synchronous machine 1 or of the vehicle is also possible.

The rotor flux target value $\psi pTarget$ is forwarded to a block 102. In this block 102, the current ip at the excitation winding 2 of the rotor 3 is predefined or controlled by means of the specification of an excitation voltage, such that the rotor flux actual value $\psi p$ is set in accordance with the rotor flux target value $\psi pTarget$. A rotation transmitter that transfers the excitation current ip to the rotating rotor 3 is not illustrated in FIG. 1 for the sake of simplicity.

The target torque MTarget is multiplied by the constant factor 2/(3 zp), wherein the result is divided by the rotor flux target value $\psi pTarget$. A target value isqTarget for the q-component isq of the stator current is thus provided. In the block 103, the phase voltages uSU, uSV, uSW and therefore the phase currents isu, isv, isw are set such that the q-component isq of the stator current follows the target value isqTarget. Besides the rotation of the rotor 3, the modulation of the rotor flux $\psi p$ also leads to induction voltages in the stator of the electric machine 1. A consideration (not illustrated in greater detail) of the rotor flux target value $\psi pTarget$ in addition to the rotor speed w improves the current control of the stator within the meaning of a feedforward control.

If the rotor flux actual value yip corresponds to the rotor flux target value $\psi pTarget$ and if the stator current actual value isq corresponds to the stator current target value isqTarget, an actual torque M is thus generated, which corresponds to the target torque MTarget. This means that the two variables influencing the torque, the rotor flux $\psi p$ and the q-component of the stator current isq or the phase currents isu, isv, isw are modulated such that, in the event of faultless operation of the electric machine, the modulations compensate for one another in terms of their effect on the generated actual torque M corresponding to equation 1.

The actual values generally only follow the target values in a delayed manner, which for example is caused by inductances of the windings and time delays in the signal transfers. The delays are known. A dynamic correction or feedforward control of the target values (rotor flux target value ψpTarget and stator current target value isqTarget) is therefore recommended, such that the modulations of the actual values ψp, isq compensate for one another in terms of their effect on the generated torque M.

If the rotor flux ψp as a result of the modulation with the test signal ψpΔ reaches a control limit, for example because the excitation current ip reaches a maximum limit, this is therefore taken into account in the modulation of the stator current isq such that the modulations still compensate for one another in terms of their effect on the generated torque M in the event of faultless operation of the electric machine 1. Accordingly, a control variable limitation of the modulated stator current isq is also taken into account with the specification of the rotor flux ψp or the excitation current ip.

A fault in the data communication, a software fault or a component fault, in a control unit, a sensor or an actuator, which influences the generated torque M, will also influence the modulations of the rotor flux ψp and/or of the stator current isq. If the excitation current ip no longer corresponds to its target value, for example due to a memory fault in the block 102 or due to a short circuit to the supply voltage, the modulation will thus also no longer be contained in the excitation current ip and therefore in the rotor flux ψp. The remaining modulation in the stator current isq then leads to a modulation in the generated torque M.

In the event of a malfunction of the electric machine 1, the modulations in the rotor flux ψp and in the stator current isq no longer cancel one another out in terms of the effect on the generated torque M, which leads in the event of a vibration-shaped test signal ψpΔ to superimposed vibrations in the generated torque M and therefore to torsional vibrations in the drivetrain. A first monitoring unit in the block 104, which monitors the rotor 3, receives the measured rotor speed w and the modulated rotor flux target value ψpTarget. If torsional vibrations, provided for example by means of correlation calculations, are detected in the drivetrain and are caused by the vibration-shaped test signal ψpΔ the excitation current ip is thus switched off and therefore the electric machine 1 is switched off by the signal b_DeAct_r. Alternatively to a switching-off, measures for correcting a faulty torque M are possible, for example by means of a correction of the stator current isq.

The modulation of the rotor flux ψp influences magnetic and electrical variables in the stator, whereas the modulation of the stator current isq influences magnetic and electrical variables in the rotor 3. Faulty operation of the electric machine 1 can also be detected on the basis of these effective mechanisms. For example, besides the rotation of the rotor 3, the modulation of the rotor flux ψp also leads to induction voltages in the stator of the electric machine 1. These induction voltages are taken into account or compensated for during the current control of the stator, that is to say during the specification of the phase voltages usu, usv, usw, such that the predefined phase currents isu, isv, isw are set. These are predefined such that the q-component isq of the stator current follows the target value isqTarget, which is likewise modulated.

A second monitoring unit is illustrated in the block 105, which takes on the phase voltages usu, usv, usw and the measured phase currents isu, isv, isw as input variables. Furthermore, the rotor flux target value ψpTarget and the measured or observed rotor speed w and also the measured or observed rotor angle of rotation θ are fed to the block 105 in order to monitor the stator. In the block 105, in order to monitor the stator, it is checked whether the magnetic and electric variables in the stator are plausible relative to the modulated rotor flux target value ψpTarget. For example, this may be achieved by comparing modeled values of the phase currents iSUMod, iSVMod, iSWMod, that is to say values determined on the basis of a mathematical model, with the measured phase currents isu, isv, isw. The mathematical model also takes into account the additional induction voltages in the stator, which are produced due to the modulation of the rotor flux ψp in the event of faultless operation. If the modulation of the rotor flux ψp changes in the event of a fault of the electric machine 1, this thus leads to deviations of the measured phase currents from the modeled phase currents. In the event of excessive deviations, the block 105 blocks the phase currents with the signal b_DeAct_s and switches off the electric machine 1. Faultless operation of the electric machine is identified when the individual measured phase currents isu, isv, isw lie within ranges that lie around the predefined courses over time of the modeled phase currents isuMod, isvMod, iswMod. This method is effective in particular at low rotor speeds, at which other methods, such as a power balance, can only be used to a limited extent.

If monitored variables are used for the rotor speed w and the rotor angle of rotation θ, only the measured phase currents isu, isv, isw are used in block 105. In block 104, only the measured rotor speed w is used in order to monitor the rotor 3. The monitoring units formed by the blocks 104 and 105 use sensors that are independent of one another and intervene via independent switch-off paths, thus resulting in high redundancy. If one of the monitoring units, an associated sensor, the associated switch-off path or an associated actuator for switch-off functions incorrectly, the electric machine is thus switched off by the other monitoring unit. In accordance with equation (1), a switch-off of the q-component isq of the stator current by blocking the phase currents isu, isv, isw or a switch-off of the rotor flux ψp by blocking the excitation current ip leads to an actual torque M=0 Nm, that is to say to zero torque or switch-off of the electric machine 1.

A modulation of the phase currents isu, isv, isw can also be used in order to produce effects on magnetic and electric variables in the rotor 3 and to verify the plausibility thereof. A modulation of the d-component isd of the stator current can advantageously be used for this purpose. This causes an induction voltage in the excitation winding 2 of the rotor 3, which is taken into account when controlling the excitation current ip. The excitation voltage is modulated such that it compensates for this induction voltage. When the electric machine 1 functions faultlessly, the modulation of the excitation voltage compensates for the modulation of the phase currents isu, isv, isw in terms of its effect on the excitation current ip. If the induction voltage changes as a result of a fault of the electric machine 1, this compensation therefore no longer takes place completely. The modulation of the phase currents presents itself in the excitation current ip. The excitation current ip deviates from its target value ipTarget and leaves a range spanned by the predefined course over time of the excitation current target value ipTarget. In the case of a synchronous machine with salient-pole rotor, the generated actual torque M is also dependent on the d-component isd of the stator current. In this case, a modulation of the d-component isd of the stator current is compensated for in terms of its effect on the generated actual torque M, for example by a suitable opposed modulation of the rotor flux ψp and/or of the q-component isq of the stator current.

The blocks 101 for establishing the target flux and 102 for determining and controlling the excitation current, and the first monitoring unit for monitoring the rotor in the block 104 are advantageously calculated in a first control unit, which is not illustrated in greater detail. The block 103 for current control of the stator is calculated in a second control unit together with a second monitoring unit of the stator in the block 105. The target torque MTarget and the rotor flux target value ψpTarget are exchanged between the control units, for example via a bus system, which is illustrated in FIG. 1 by a dashed line B. Each of the two control units contains a monitoring unit and can switch off the electric machine 1 if a malfunction is detected. High safety requirements can therefore be met. The illustrated partitioning of the functions is to be considered as an example, and as a result other divisions between a plurality of control units are also possible. A further application of the modulation according to the invention by a test signal lies in the calibration of sensors or the inspection of sensors during operation. For example, a conclusion can be drawn with regard to the current rotor angle of rotation θ from the modulation of the rotor flux ψp and the effect thereof on the magnetic and electric variables in the stator. This can be used to calibrate a rotor angle of rotation sensor, that is to say to produce a reference between the signal of the rotor angle of rotation sensor and the current electric rotor angle of rotation, for example after assembly of the rotor angle sensor or for inspection thereof during running operation.

Sensorless control methods, which dispense with a rotor angle of rotation sensor or rotor speed sensor on the electric machine, can be assisted by the proposed modulation. These methods otherwise function particularly well only at higher rotor speeds. The modulation can also be used for an emergency operation of the electric machine in the event of a failure of the rotor angle of rotation sensor or rotor speed sensor.

A further application of the modulation according to the invention by means of a test signal lies in the adaptation of characteristic values of the electric machine 1, for example of inductances, mutual inductances, and resistances, which are important for the control. For example, a conclusion can be drawn from the modulation of the rotor flux ψp and the effect thereof on the magnetic and electric variables in the stator as to the current magnetic and electric properties of the electric machine 1.

The invention claimed is:

1. A method for detecting a malfunction of an electric machine, the method comprising:
    modulating a first variable (isq) influencing the torque (M) of the electric machine (1) by superimposing a test signal on the first variable;
    modulating a second variable (ψp) influencing the torque of the electric machine by superimposing a test signal on the second variable;
    detecting an effect of the first and second variables (ψp, isq) on a parameter of the electric machine (1), the parameter being at least one selected from the group consisting of a torque (M), a speed, an electric parameter, and a magnetic parameter; and
    determining a fault condition based on the effect.

2. The method as claimed in claim 1, wherein the first variable (isq) influencing the torque (M) is associated with a stator of the electric machine, whereas the second variable (ψp) influencing the torque (M) is associated with a rotor (3) of the electric machine (1).

3. The method as claimed in claim 2, wherein the variable associated with the stator is a stator current (isq), whereas the variable associated with the rotor is a rotor flux (ψp).

4. The method as claimed in claim 2, wherein after the modulation of the variables (ψp) influencing the rotor (3) of the electric machine (1), a first actual parameter (isu, isv, isw) at the stator of the electric machine (1) is measured and compared with a range spanned by a predefined course over time of a predefined first parameter (isuMod, isvMod, iswMod).

5. The method as claimed in claim 2, wherein after the modulation of the variables (isu, isv, isw) influencing the stator of the electric machine (1), a second actual parameter (ip) at the rotor (3) of the electric machine (1) is measured and compared with a range spanned by a predefined course over time of a predefined second parameter (ipTarget).

6. The method as claimed in claim 1, wherein a signal boundary is taken into account during the modulation of the test signal (ψpΔ) to the base signal, wherein the test signal (ψpΔ) is selected such that, after modulation, the modulated base signal does not exceed the signal boundary.

7. The method as claimed in claim 1, wherein at least one test signal (ψpΔ) consists of a vibration.

8. The method as claimed in claim 1, wherein the test signals (ψpΔ) are superimposed continuously to the first and the second variable (ψp, isq) influencing the torque (M) of the electric machine (1).

9. The method as claimed in claim 1, wherein the test signals (ψpΔ) in at least one defined operating state of the electric machine (1) are superimposed to the first and the second variable (ψp, isq) influencing the torque (M) of the electric machine (1).

10. The method as claimed in claim 1, wherein the first and the second variables (ψp, isq) influencing the torque (M) of the electric machine (1) are modulated with test signals (ψpΔ), which have an opposed sign.

11. The method as claimed in claim 1, wherein after the modulation of the first and of the second variables (ψp, isq) influencing the torque (M) of the electric machine (1), an actual parameter (isu, isv, isw) of the electric machine (1) is measured, and a faultless operation of the electric machine (1) occurs if said actual parameter (isu, isv, isw) lies within a range spanned by a predefined course over time of a predefined parameter (isuMod, isvMod, iswMod).

12. The method as claimed in claim 11, wherein after the modulation of the first and second variable (ψp, isq) influencing the torque of the electric machine (1), a torsional vibration at a drivetrain of a motor vehicle is measured and compared with a range spanned by the predefined course over time of a predefined torsional vibration.

13. The method as claimed in claim 12, wherein the torsional vibration, the speed of the electric machine (1), a first actual parameter and/or a second actual parameter are each monitored separately from one another in a respective monitoring path.

14. The method as claimed in claim 13, wherein at least two independent monitoring paths are activated simultaneously, in order to monitor the malfunction of the electric machine (1).

15. The method as claimed in claim 13, wherein the monitoring paths lead to at least one common switch-off path of the electric machine and/or one common path for influencing the mode of operation of the electric machine (1).

16. The method as claimed in claim 13, wherein each of the monitoring paths leads to at least one switch-off path of the electric machine and/or one path for influencing the mode of operation of the electric machine (1).

17. The method as claimed in claim 11, wherein after the modulation of the first and second variable ($\psi p$, isq) influencing the torque of the electric machine (1), a speed output by the electric machine (1) is measured and compared with a range spanned by the predefined course over time of a predefined speed.

18. A device for detecting a malfunction of an electric machine, the device comprising:
  at least one control unit configured to
    modulate a first variable (isq) influencing the torque (M) of the electric machine (1) by superimposing a test signal on the first variable;
    modulate a second variable ($\psi p$) influencing the torque (M) of the electric machine (1) by superimposing a test signal on the second variable;
    detect an effect of the first and second variables on a parameter, the parameter being at least one selected from the group consisting of a torque (M), a speed, an electric parameter, and a magnetic parameter; and
    determine a fault condition based on the effect.

19. The device as claimed in claim 18, further comprising
  at least one monitoring path, leading to at least one switch-off path;
  and
  a monitoring unit configured to
    detect a parameter of a stator of the electric machine; and
    detect a parameter of a rotor of the electric machine.

20. The device as claimed in claim 19, wherein the parameter of a stator is a torsional vibration.

21. The device as claimed in claim 19, wherein the parameter of a stator is a speed.

* * * * *